US006765237B1

(12) United States Patent
Doxsee et al.

(10) Patent No.: US 6,765,237 B1
(45) Date of Patent: Jul. 20, 2004

(54) WHITE LIGHT EMITTING DEVICE BASED ON UV LED AND PHOSPHOR BLEND

(75) Inventors: Daniel Darcy Doxsee, Sagamore Hills, OH (US); Cherian Jacob, Brecksville, OH (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 10/342,995

(22) Filed: Jan. 15, 2003

(51) Int. Cl.[7] .............................................. H01L 29/227
(52) U.S. Cl. .................. 257/98; 313/503; 252/301.4 R; 438/27
(58) Field of Search ............................ 257/79, 98, 100; 313/501, 503; 252/301.4 R; 438/22, 27; 362/84, 800

(56) References Cited

U.S. PATENT DOCUMENTS

| | | | |
|---|---|---|---|
| 5,851,963 A | 12/1998 | Doughty et al. | |
| 5,959,316 A | 9/1999 | Lowery | |
| 5,962,971 A | 10/1999 | Chen | |
| 6,252,254 B1 | 6/2001 | Soules et al. | |
| 6,255,670 B1 | * 7/2001 | Srivastava et al. | ............. 257/89 |
| 6,278,135 B1 | 8/2001 | Srivastava et al. | |
| 6,294,800 B1 | 9/2001 | Duggal et al. | |
| 6,319,425 B1 | 11/2001 | Tasaki et al. | |
| 6,409,938 B1 | 6/2002 | Comanzo | |
| 6,466,135 B1 | * 10/2002 | Srivastava et al. | ....... 340/815.4 |
| 6,596,195 B2 | * 7/2003 | Srivastava et al. | .... 252/301.4 R |
| 6,621,211 B1 | * 9/2003 | Srivastava et al. | .......... 313/503 |
| 6,660,186 B2 | * 12/2003 | Ravilisetty | ........... 252/301.4 R |
| 6,669,866 B1 | * 12/2003 | Kummer et al. | ...... 252/301.4 R |

| | | | |
|---|---|---|---|
| 2002/0158565 A1 | * 10/2002 | Setlur et al. | ................ 313/486 |
| 2003/0030060 A1 | 2/2003 | Okazaki | |

FOREIGN PATENT DOCUMENTS

| | | |
|---|---|---|
| EP | 1 138 747 A2 | 10/2001 |
| EP | 1 139 440 A2 | 10/2001 |
| WO | WO 00/33389 | 6/2000 |
| WO | WO 01/89000 A 1 | 11/2001 |

OTHER PUBLICATIONS

Narukawa, Yukio, "Present Status of UV–LDs and White LEDs", Patented Abstracts of the International Synoposium on The Light for the 2nd Century, Mar. 2002, Tokyo, K–4, pp. 14–15.

* cited by examiner

*Primary Examiner*—Sara Crane
(74) *Attorney, Agent, or Firm*—Fay, Sharpe, Fagan, Minnich & McKee, LLP

(57) ABSTRACT

A light source including a specific LED and phosphor combination capable of emitting white light for direct illumination. In one embodiment, the light source includes an LED chip emitting in the 380–420 nm range radiationally coupled to a phosphor blend first phosphor selected from the group consisting of $(Sr,Ba,Ca,Mg)_5(PO_4)_3Cl:Eu^{2+}$ (SECA) and $BaMg_2Al_{16}O_{27}:Eu^{2+}$ with a second phosphor having the formula $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5. The light source thus produced will provide a high quality white light.

30 Claims, 4 Drawing Sheets

WHITE LIGHT EMITTING DEVICE BASED ON UV LED AND PHOSPHOR BLEND

BACKGROUND OF THE INVENTION

The present invention relates to a visible light emitting device comprising an LED or laser diode and a phosphor. More particularly, the present invention relates to a white light emitting device comprising a near UV LED chip or laser diode and one or more near UV/blue excitable phosphors.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III–V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. By interposing a phosphor excited by the radiation generated by the LED, light of a different wavelength, e.g., in the visible range of the spectrum may be generated. Often, a combination of LED generated light and phosphor generated light may be used to produce the visible light (e.g. white). The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength at about 450 nm combined with a yellow light-emitting phosphor, such as cerium doped yttrium aluminum garnet $Y_3Al_5O_2:Ce^{3+}$ ("YAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light. Such a device, while suitable for limited applications, fails in applications where a true bright white light of high intensity and brightness is desired.

In addition to this somewhat limited emission intensity, the color output of such an LED-phosphor system varies greatly due to frequent, unavoidable routine deviations from desired parameters (i.e. manufacturing systemic errors) during the production of the light. For example, the color output of the finished device is very sensitive to the thickness of the phosphor layer covering the LED. If the phosphor is too thin, then more than a desired amount of the blue light emitted by the LED will penetrate through the phosphor and the combined phosphor-LED output will appear bluish. In contrast, if the phosphor layer is too thick, then less than a desired amount of the blue LED light will penetrate through the phosphor layer. In this case, the combined phosphor-LED output will appear yellowish. Therefore, the thickness of the phosphor layer is an important variable affecting the color output of a blue LED based system. Unfortunately, the thickness of the phosphor layer is difficult to control during large scale production of LED-phosphor lamp systems, and the variations in phosphor thickness often result in relatively poor lamp to lamp color control. In addition, lamp to lamp variations occur due to the varying of the optical power from chip to chip.

The use of a UV LED chip to manufacture such a white-light system should give superior color performance compared to those based on blue LED chips since the UV chip is not appreciably contributing to the visible color of the LED.

Thus, a need exists for an efficient white-light LED-phosphor light using a UV LED chip and showing improved lamp to lamp color control and acceptable luminous efficacy.

SUMMARY OF THE INVENTION

In one aspect, the present invention provides a white-light emitting device including a UV semiconductor light source having a peak emission from about 380 to about 420 nm and a phosphor blend including a first phosphor comprising $BaMg_2Al_{16}O_{27}:Eu^{2+}$ (BAM) and a second phosphor comprising $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5.

In a second aspect, the present invention provides a phosphor blend including first phosphor comprising $Tb_3Al_{4.9}O_{12}:Ce$ and a second phosphor selected from the group consisting of $BaMg_2Al_{16}O_{27}:Eu^{2+}$ (BAM) and $(Sr,Ba,Ca,Mg)_5(PO_4)_3Cl:Eu^{2+}$.

In a third aspect, a method for forming a lighting apparatus is provided, the method including the steps of providing a semiconductor UV light source capable of omitting radiation having a peak emission from about 380 to about 420 nm, and radiationally coupling a phosphor blend to the semiconductor light source, the phosphor blend including a first phosphor selected from the group consisting of $BaMg_2Al_{16}O_{27}:Eu^{2+}$ and $(Sr,Ba,Ca,Mg)_5(PO_4)_3Cl:Eu^{2+}$ and a second phosphor comprising $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5; wherein the phosphor blend is capable of absorbing the radiation emitted by the semiconductor light source and converting the radiation into white light.

In a fourth aspect, the present invention provides a white-light emitting device including a UV semiconductor light source having a peak emission from about 380 to about 420 nm and a phosphor blend including a first phosphor comprising $(Sr,Ba,Ca,Mg)_5(PO_4)_3Cl:Eu^{2+}$ and a second phosphor comprising $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5.

DETAILED DESCRIPTION OF THE INVENTION

Phosphors convert radiation (energy) to visible light. Different combinations of phosphors provide different colored light emissions. The colored light that originates from the phosphors provides a color temperature.

A fluorescent lamp conversion phosphor material blend (material blend) converts generated radiation to visible light. The fluorescent light color is dependent on the particular components of the material blend. The material blend may include two or more phosphors of basic color, for example a particular mix with one or more of a yellow and blue phosphor to emit a desired color (tint) of light.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor conversion material blend including the individual phosphors convert radiation at a specified wavelength, for example radiation from about 380 to about 420 nm as emitted by a LED, into visible light. The visible light provided by the phosphor conversion material blend comprises a bright white light with high intensity and brightness.

Figure 1:
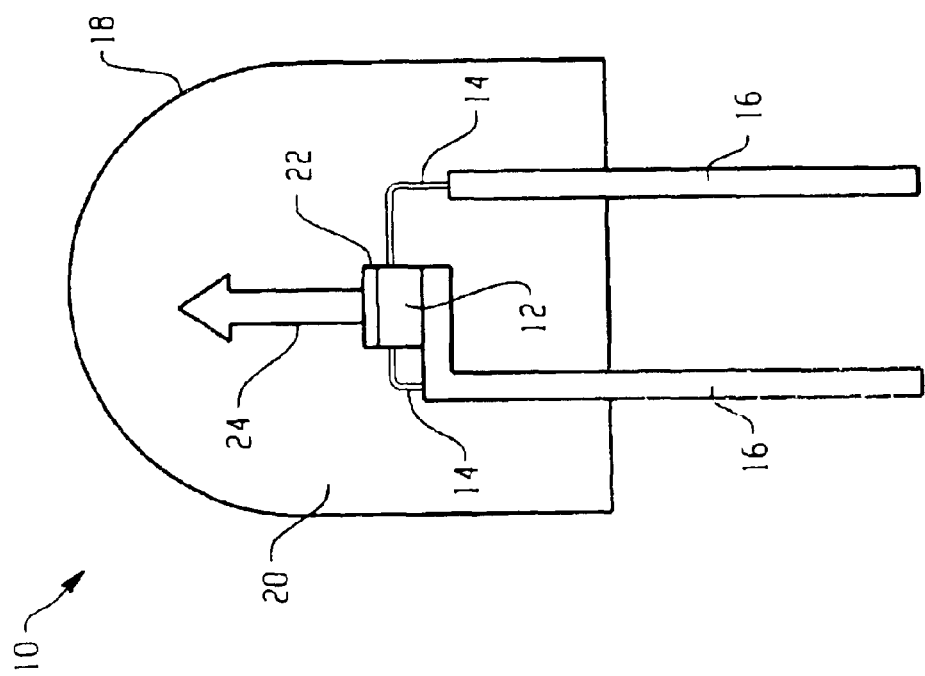
FIG. 1 is a schematic cross-sectional view of a white light illumination system in accordance with one embodiment of the present invention.

With reference to FIG. 1, an exemplary light emitting assembly or lamp 10 is shown in accordance with one embodiment of the present invention. The light emitting assembly 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor UV light source that is capable of producing white light when its emitted radiation is directed onto the phosphor. In a preferred embodiment, the semiconductor UV light source comprises a LED doped with various impurities. Thus, the LED may comprise a semiconductor diode based on any suitable III–V, II–VI or IV—IV semiconductor layers and having an emission wavelength of about 380 to 420 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and i+J+k=1) having an emission wavelength greater than about 380 nm and less than about 420 nm. Preferably, the UV chip has a peak emission wavelength from about 400 to about 410 nm. Such LED semiconductors are known in the art. The radiation source is described herein as an LED for convenience. However, as used herein, the term is meant to encompass all semiconductor radiation sources including semiconductor laser diodes.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and the phosphor 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The first preferred structure of the illumination system includes a phosphor 22 radiationally coupled to the LED chip 12. Radiationally coupled means that the elements are associated with each other so radiation from one is transmitted to the other. In a preferred embodiment, the phosphor is a blend of two or more phosphors, as will be detailed below. This phosphor blend 22 is deposited on the LED 12 by any appropriate method. For example, a water based suspension of the phosphor(s) can be formed, and applied as a phosphor layer to the LED surface. In one such method, a silicone slurry in which the phosphor particles are randomly embedded is placed around the LED. This method is merely exemplary of possible positions of the phosphor conversion material blend 14 and LED 12. Thus, the phosphor 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements.

Figure 2:
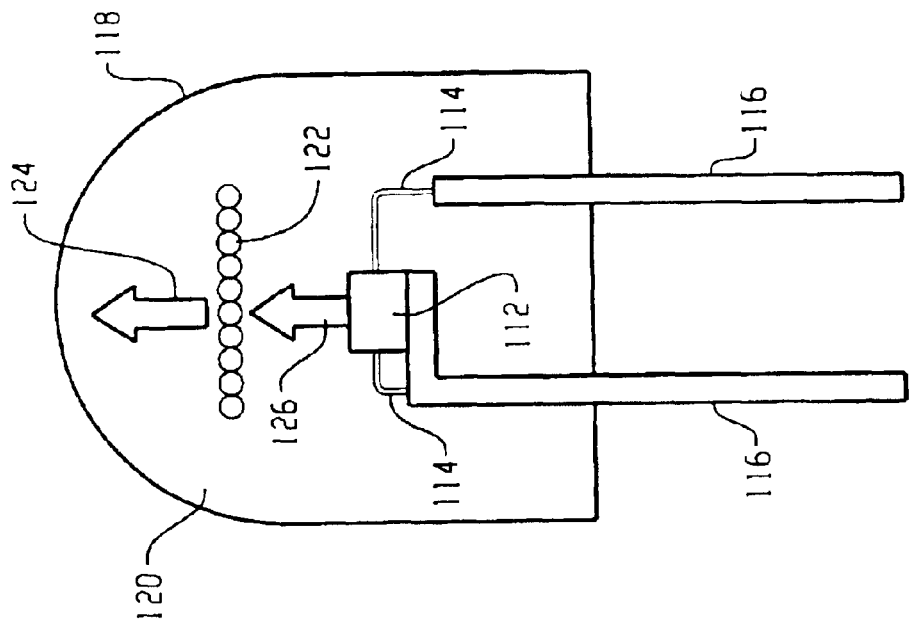
FIG. 2 is a schematic cross-sectional view of a white light illumination system in accordance with a second embodiment of the present invention.

FIG. 2 illustrates a second preferred structure of the system according to the preferred aspect of the present invention. The structure of the embodiment of FIG. 2 is the same as that of FIG. 1, except that the phosphor 122 is interspersed within the encapsulant material 120, instead of being formed directly on the LED chip 112. The phosphor powder may be interspersed within a single region of the encapsulant material 120 or, more preferably, throughout the entire volume of the encapsulant material. The UV light 126 emitted by the LED chip 112 mixes with the light emitted by the phosphor 122, and the mixed light appears as white light 124. If the phosphor is to be interspersed within the encapsulant material 120, then the phosphor powder may be added to a polymer precursor, loaded around the LED chip 112, and then the polymer precursor may be cured to solidify the polymer material. Other known phosphor interspersion methods may also be used, such as transfer loading.

Figure 3:
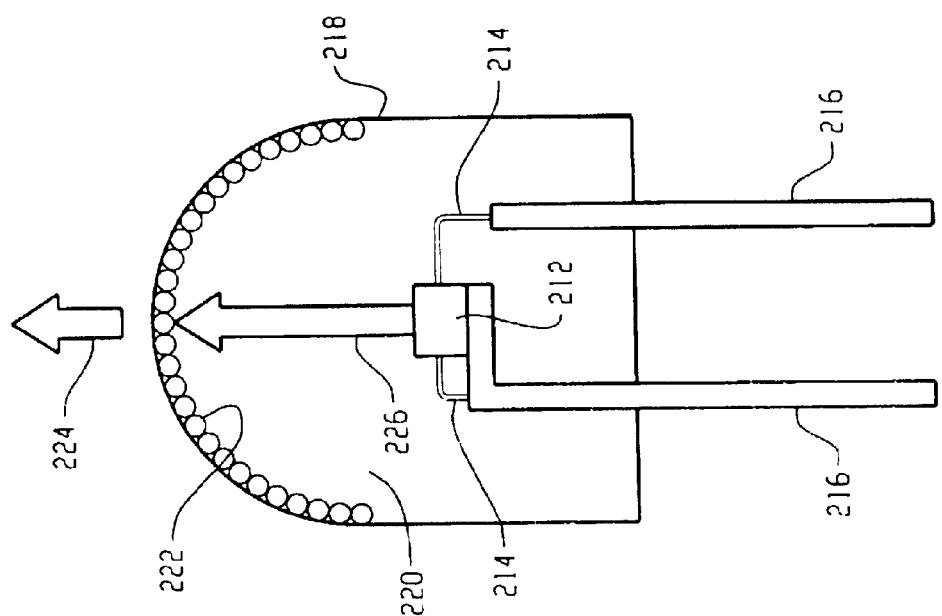
FIG. 3 is a schematic cross-sectional view of a white light illumination system in accordance with a third embodiment of the present invention.

FIG. 3 illustrates a third preferred structure of the system according to the preferred aspects of the present invention. The structure of the embodiment shown in FIG. 3 is the same as that of FIG. 1, except that the phosphor 222 is coated onto a surface of the shell 218, instead of being formed over the LED chip 212. The phosphor is preferably coated on the inside surface of the shell 218, although the phosphor may be coated on the outside surface of the shell, if desired. The phosphor 222 may be coated on the entire surface of the shell or only a top portion of the surface of the shell. The UV light 226 emitted by the LED chip 212 mixes with the light emitted by the phosphor 222, and the mixed light appears as white light 224. Of course, the embodiments of FIGS. 1–3 may be combined and the phosphor may be located in any two or all three locations or in any other suitable location, such as separately from the shell or integrated into the LED.

In any of the above embodiments, the lamp 10 may also include a plurality of scattering particles (no shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption. The coupling of the diffuse scattered LED light with the phosphor is advantageous in reducing optical saturation effects and physical damage of the phosphor material.

Figure 4:
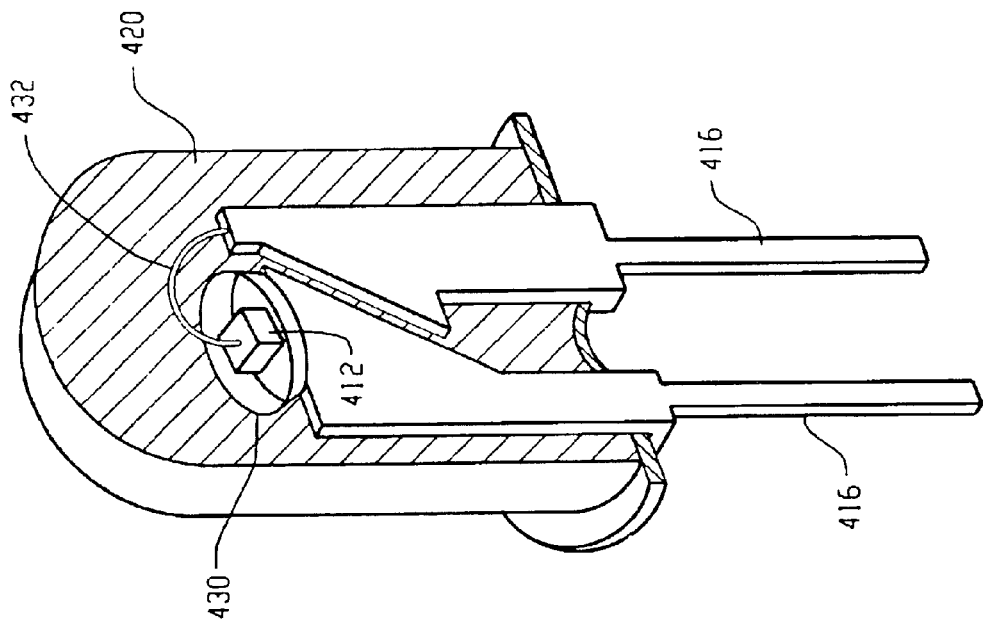
FIG. 4 is a cutaway side perspective view of an illumination system in accordance with a fourth embodiment of the present invention.

As shown in a fourth embodiment in FIG. 4, the LED chip 412 may be mounted in a reflective cup 430. The cup 440 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

The phosphor 22 used in the invention is a blend of two or more phosphors. When used in a lighting assembly in combination with a UV LED emitting radiation in the range of about 380 to 420 nm, the resultant light emitted by the assembly will be a white light. In one embodiment, the phosphor blend comprises a blend of the blue phosphor $BaMg_2Al_{16}O_{27}$:$Eu^{2+}$ (BAM) and a second phosphor having the general formula $(Tb_{1-x-y}A_xRE_y)_3D_zO_{12}$ (hereinafter also called "TAG"), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, preferably from 0 to about 0.3, more preferably from 0 to about 0.2; and y is in the range from about 0.00 to about 0.2, preferably from about 0.005 to about 0.1, more preferably from about 0.005 to about 0.07; and z is in the range from about 4 to about 5, preferably from about 4.5 to 5, more preferably from about 4.6 to less than about 5.

The TAG phosphor for use in the phosphor blend of the present invention may be produced by a method comprising the steps of: (1) providing stoichiometric amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In; (2) mixing together the oxygen-containing compounds to form a mixture; and (3) firing the mixture in a reducing atmosphere at a temperature and for a time sufficient to convert the mixture to a rare earth-activated terbium-containing garnet phosphor.

An amount of fluoride of at least one metal selected from the group consisting of terbium, aluminum, gallium, and indium may be added as a fluxing agent into the mixture of the oxygen-containing compounds before or during the step of mixing. A quantity of a fluoride compound of less than about 20, preferably less than about 10, percent by weight of the total weight of the mixture is adequate for fluxing purposes.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired under a reducing atmosphere at a temperature from about 900° C. to about 1700° C., preferably from about 1000° C. to about 1600° C., more preferably from about 1200° C. to about 1500° C. for a time sufficient to convert all of the mixture to the final garnet composition. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof Alternatively, the crucible containing the mixture may be packed in a second closed crucible containing high-purity carbon particles and fired in air so that the carbon particles react with the oxygen present in air, thereby, generating carbon monoxide that is needed to provide the reducing atmosphere.

One or more of the starting materials for the phosphor synthesis may be oxygen-containing compounds other than oxides, such as nitrates, sulfates, acetates, citrates, or chlorates. For example, amounts of $Tb_4O_7$, $Al(NO_3)_3 \cdot 9H_2O$, $Ce(NO_3)_3 \cdot 6H_2O$ and $AlF_3$ may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution containing Tb, Ce, and Al while stirring to precipitate a mixture of hydroxides of Tb, Ce, and Al. An organic base such as methanolamine, ethanolamine, propanolamine, dimethanolamine, diethanolamine, dipropanolamine, trimethanolamine, triethanolamine, or tripropanolamine may be used in place of ammonium hydroxide. The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1200–1600° C. for a sufficient time under a reducing atmosphere such as $H_2$, CO, or a mixture of one of theses gases with an inert gas, or an atmosphere generated by a reaction between a coconut charcoal and the products of the decomposition of the oxygen-containing compounds to covert all of the calcined material to the desired phosphor composition.

In general, it has been found that the phosphors have higher quantum efficiency when their compositions are non-stoichiometric. Table 1 below shows that high quantum efficiency is achieved for phosphors having a general formula of $Tb_aAl_bO_{12}:Ce^{3+}$, where both a/b is different from 0.6 and b is less than 5. The relative quantum efficiency reported in Table 1 is compared against a standard cerium-activated yttrium aluminate garnet phosphor.

TABLE 1

| Sample Batch No. | a/b | b | Batch Size (g) | Firing Condition | Relative Quantum Efficiency (%) |
|---|---|---|---|---|---|
| D0213 | 0.594 | 4.9 | 150 | Packed in carbon | 98 |
| D0207 | 0.594 | 4.9 | 100 | Packed in carbon | 93 |
| D0208 | 0.594 | 4.9 | 100 | Fired in $H_2$ | 97 |
| D0215 | 0.594 | 4.9 | 250 | Packed in carbon | 88 |
| D0220 | 0.582 | 5 | 250 | Packed in carbon | 88 |
| D0225 | 0.613 | 4.75 | 250 | Fired twice in carbon pack | 92 |

Figure 5:
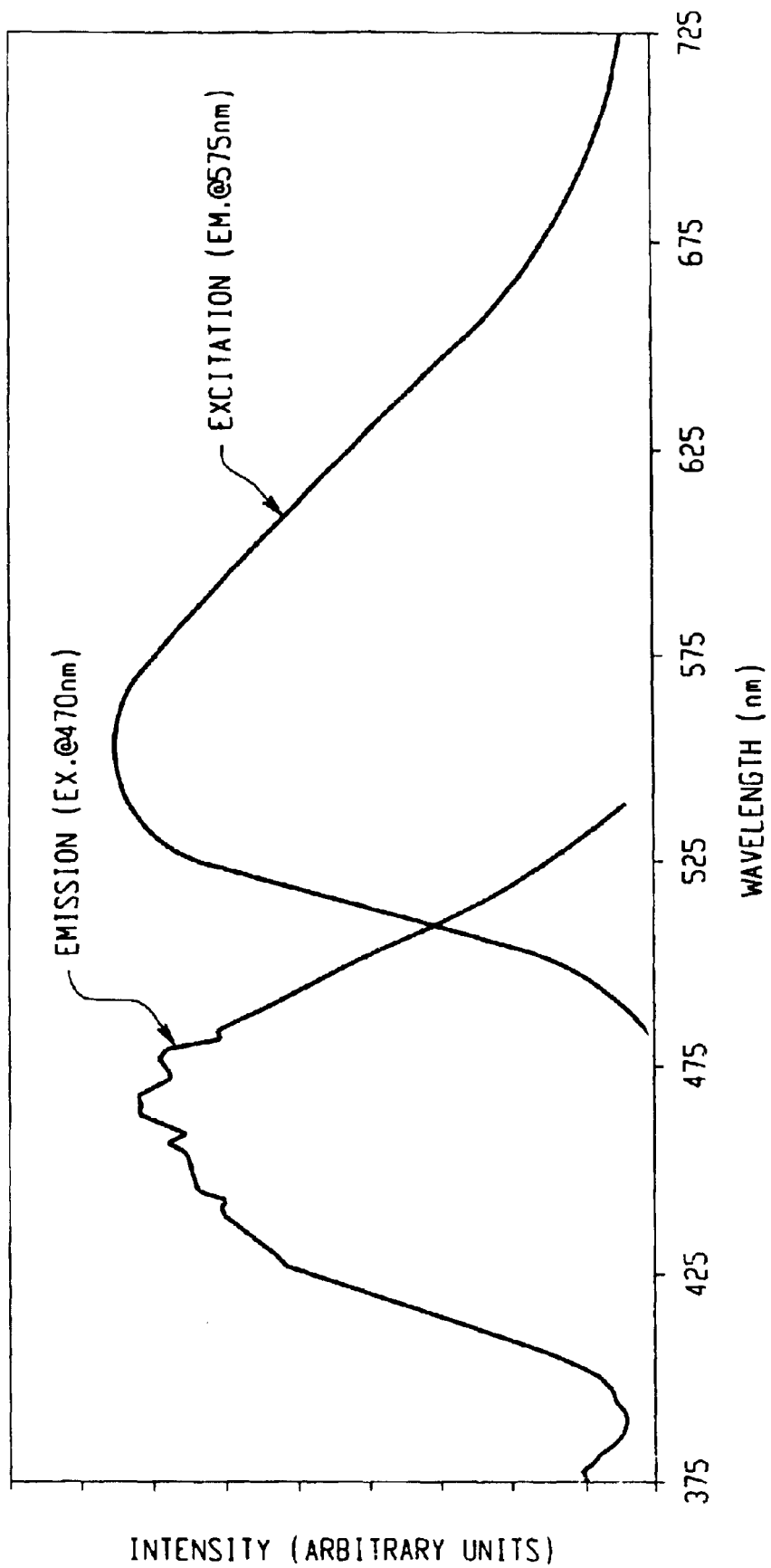
FIG. 5 is a graph of the absorption and emission spectra of $Tb_3Al_{4.90}O_{12}:Ce$.

In one preferred embodiment, the TAG:Ce phosphor is terbium aluminum garnet activated with cerium having the formula $(Tb_{x-y}Ce_y)_aAl_{4.9}O_{12}$ where y takes the values as defined above and a is in the range from about 2.8 to 3. Thus, a preferred phosphor conversion material blend comprises a blend of BAM and $Tb_3Al_{4.9}O_{12}$:Ce. FIG. 5 is a graph of the absorption and emission of $Tb_3Al_{4.9}O_{12}$:Ce. This phosphor has an emission with color coordinates on the CIE chromaticity diagram of x=0.467 and y=0.522 under 470 nm excitation.

In a second embodiment, the phosphor blend includes a blend of the TAG:Ce phosphor described above and the commercially available phosphor $(Sr,Ba,Ca,Mg)_5(PO_4)_3Cl:Eu_{2+}$ (SECA). SECA and BAM phosphors are known in the lighting art and are described in commonly assigned U.S. Pat, No. 6,255,670 to Srivastava et al., the disclosure of which is incorporated herein by reference. Accordingly, a further description of these well-known phosphors is omitted.

Figure 6:
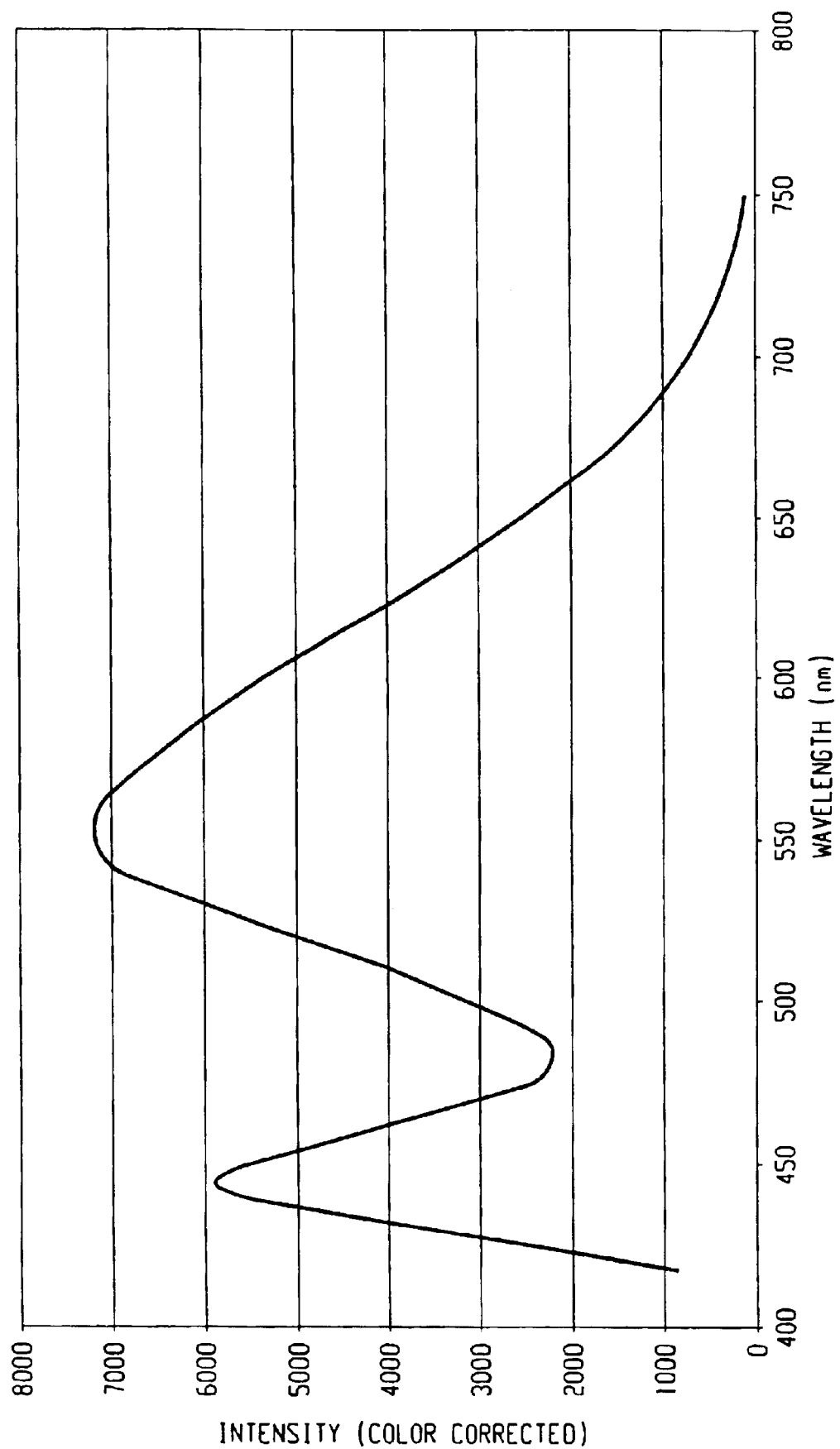
FIG. 6 is a graph of the emission spectrum of a phosphor blend including $Tb_3Al_{4.9}O_{12}:Ce$ and $(Sr,Ba,Ca,Mg)5(PO_4)_3Cl:Eu^{2+}$.

The weight ratio of each of the individual phosphors in the phosphor blend may vary depending on the characteristics of the desired light output. Preferably, the weight ratio of TAG to the other phosphor (either BAM or SECA) will be about 1.5–2.5:1 and more preferably about 1.9:1. Depending on the relative amounts of each of the individual phosphors employed in the phosphor blend, the resulting white light will have the coordinates x=0.340–0.360 and y=0.340–0.360 on the CIE chromaticity diagram and an emission spectra showing a peak emission at about 530–570 nm and a secondary peak at about 420–460 nm when excited by a near UV emission at 410 nm. FIG. 6 shows the emission spectrum of a phosphor blend of TAG and SECA under 410 nm excitation with a peak emission at about 550 nm and a secondary peak at about 440 nm and color coordinates on the CIE chromaticity diagram of x=0.349 and y=0.385, which corresponds to a soft white color. The exact color can be modified by altering the relative concentrations of the individual phosphors in the phosphor blend.

The invention has been described with reference to various preferred embodiments. Obviously, modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a semiconductor light source emitting radiation having a wavelength in the range of from about 380 to about 420 nm;
   a phosphor blend radiationally coupled to the semiconductor light source, the phosphor blend including a first phosphor comprising $BaMg_2Al_{16}O_{27}:Eu^{2+}$ and a second phosphor comprising $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5.

2. The lighting apparatus of claim 1, wherein the white light has the coordinates x=0.340–0.360 and y=0.340–0.360 on the CIE chromaticity diagram.

3. The lighting apparatus of claim 1, wherein the semiconductor light source is a light emitting diode (LED).

4. The lighting apparatus of claim 3, wherein the LED comprises a nitride compound semiconductor represented by the formula $In_iGa_jAl_kN$, where $0 \leq i$; $0 \leq j$, $0 \leq K$, and i+j+k=1.

5. The lighting apparatus of claim 1, wherein the phosphor is coated on the surface of the semiconductor light source.

6. The lighting apparatus of claim 1, further comprising an encapsulant surrounding the semiconductor light source and the phosphor.

7. The lighting apparatus of claim 1, wherein the phosphor blend is dispersed in the encapsulant.

8. The lighting apparatus of claim 1, further comprising a reflector cup.

9. The lighting apparatus of claim 1, wherein x is from about 0 to about 0.2.

10. The lighting apparatus of claim 1, wherein z is from about 4.6 to about 5.

11. The lighting apparatus of claim 1, wherein the TAG phosphor has the formula $Tb_3Al_{4.9}O_{12}$:Ce.

12. The lighting apparatus of claim 1, wherein the TAG phosphor and the BAM phosphor are present in a weight ratio of 1.5–2.5:1 in the phosphor blend.

13. The lighting apparatus of claim 12, wherein the TAG phosphor and the BAM phosphor are present in a weight ratio of about 1.9:1 in the phosphor blend.

14. The lighting apparatus of claim 1, wherein the semiconductor light source emits radiation having a wavelength of from 400–410 nm.

15. A lighting apparatus comprising:

a semiconductor light source emitting radiation having a wavelength in the range of about 430 nm;

a phosphor blend radiationally coupled to said semiconductor light source, said phosphor blend including a first phosphor comprising $(Sr,Ba,Ca,Mg)_5(PO_4)_3Cl:Eu^{2+}$ (SECA) and a second phosphor comprising $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5;

wherein the phosphor blend is capable of absorbing the radiation emitted by the semiconductor light source and converting the radiation into white light.

16. The lighting apparatus of claim 15, wherein x is from about 0 to about 0.2.

17. The lighting apparatus of claim 15, wherein z is from about 4.6 to about 5.

18. The lighting apparatus of claim 15, wherein the TAG:Ce phosphor has the formula $Tb_3Al_{4.9}O_{12}$:Ce.

19. The lighting apparatus of claim 15, wherein the white light has the coordinates x=0.340–0.360 and y=0.340–0.360 on the CIE chromaticity diagram.

20. The lighting apparatus of claim 15, wherein the semiconductor light source is a light emitting diode (LED).

21. The lighting apparatus of claim 15, wherein the LED comprises a nitride compound semiconductor represented by the formula $In_iGa_jAl_kN$, where $0 \leq i$; $0 \leq j$; $0 \leq K$, and i+j+k=1.

22. The lighting apparatus of claim 15, wherein the phosphor is coated on the surface of the semiconductor light source.

23. The lighting apparatus of claim 15, further comprising an encapsulant surrounding the semiconductor light source and the phosphor.

24. The lighting apparatus of claim 15, wherein the phosphor blend is dispersed in the encapsulant.

25. The lighting apparatus of claim 15, further comprising a reflector cup.

26. The lighting apparatus of claim 15, wherein the TAG phosphor and the SECA phosphor are present in a weight ratio of 1.5–2.5:1 in the phosphor blend.

27. The lighting apparatus of claim 12, wherein the TAG phosphor and the SECA phosphor are present in a weight ratio of about 1.9:1 in the phosphor blend.

28. The lighting apparatus of claim 1, wherein the semiconductor light source emits radiation having a wavelength of from 400–410 nm.

29. A method for forming a lighting apparatus, the method comprising the steps of:

providing a near TV LED capable of emitting radiation having a wavelength of about 38–420 nm;

radiationally coupling a phosphor blend to the LED, the phosphor blend including a first phosphor selected from the group consisting of $(Sr,Ba,Ca,Mg)_5(PO_4)_3Cl:Eu^{2+}$ (SECA) and $BaMg_2Al_{16}O_{27}:Eu^{2+}$ with a second phosphor having the formula $(Tb_{1-x-y}A_xRE_y)_3D_zO_{12}$ (TAG:Ce), where A is a member selected from the group consisting of Y, La, Gd, and Sm; RE is a member selected from the group consisting of Ce, Pr, Nd, Srn, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5;

wherein the phosphor is capable of absorbing the radiation emitted by the semiconductor light source and converting the radiation into white light having the coordinates x=0.340–0.360 and y=0.340–0.360 on the CIE chromaticity diagram.

30. A phosphor blend including a first phosphor selected from the group consisting of $(Sr,Ba,Ca,Mg)_5(PO_4)_3Cl:Eu^{2+}$ (SECA) and $BaMg_2Al_{16}O_{27}:Eu^{2+}$ with a second phosphor having the formula $(Tb_{1-x-y}A_xRE_y)_3D_zO_{12}$ (TAG:Ce), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In, x is in the range from 0 to about 0.5, y is in the range from about 0 to about 0.2, and z is in the range from about 4 to 5;

wherein the phosphor is capable of absorbing the radiation emitted by a semiconductor light source emitting from 380–420 nm and converting the radiation into white light having the coordinates x=0.340–0.360 and y=0.340–0.360 on the CIE chromatically diagram.

* * * * *